US007656037B2

(12) United States Patent
Hommel et al.

(10) Patent No.: US 7,656,037 B2
(45) Date of Patent: Feb. 2, 2010

(54) INTEGRATED CIRCUIT WITH IMPROVED COMPONENT INTERCONNECTIONS

(75) Inventors: Martina Hommel, Munich (DE); Heinrich Koerner, Bruckmuehl (DE); Markus Schwerd, Holzkirchen (DE); Martin Seck, Munich (DE)

(73) Assignee: Infineon Technologies AG, Munich (DE)

( * ) Notice: Subject to any disclaimer, the term of this patent is extended or adjusted under 35 U.S.C. 154(b) by 270 days.

(21) Appl. No.: 11/525,113

(22) Filed: Sep. 21, 2006

(65) Prior Publication Data

US 2007/0071053 A1    Mar. 29, 2007

(30) Foreign Application Priority Data

Sep. 21, 2005    (DE) ................. 10 2005 045 059

(51) Int. Cl.
| | |
|---|---|
| H01S 5/00 | (2006.01) |
| H01S 3/13 | (2006.01) |
| H01L 23/52 | (2006.01) |
| H01L 23/522 | (2006.01) |
| H01L 27/08 | (2006.01) |
| H01L 23/64 | (2006.01) |

(52) U.S. Cl. ............................... 257/758; 257/E23.155; 257/E23.152; 257/E27.005; 257/E27.014; 257/E43.006; 257/E27.048; 257/E21.012; 257/E27.112; 257/E21.703; 257/303; 257/296; 257/298; 257/300; 257/301; 257/308; 257/347; 372/46.012; 372/29.011

(58) Field of Classification Search ................. 257/758, 257/E23.155, E21.582, E23.152, E27.005, 257/E27.014, E43.006, 303, 296, 298, 300, 257/301, 308, E27.048, E21.012, 347, E27.112, 257/E21.703; 372/46.012
See application file for complete search history.

(56) References Cited

U.S. PATENT DOCUMENTS

| 5,943,598 | A | 8/1999 | Lin |
| 6,297,524 | B1 | 10/2001 | Vathulya et al. |
| 6,480,086 | B1 * | 11/2002 | Kluge et al. ................. 336/200 |
| 6,690,570 | B2 | 2/2004 | Hajimiri et al. |
| 6,770,512 | B1 | 8/2004 | Mahanpour et al. |
| 6,808,975 | B2 | 10/2004 | Song et al. |
| 7,463,112 | B1 * | 12/2008 | Groves ........................ 333/33 |
| 2004/0142583 | A1 * | 7/2004 | Mathieu et al. ............... 439/66 |
| 2005/0117315 | A1 * | 6/2005 | Weekamp .................... 361/765 |
| 2007/0008060 | A1 * | 1/2007 | Weller et al. ................. 336/229 |
| 2007/0071052 | A1 * | 3/2007 | Hommel et al. ........ 372/46.012 |
| 2007/0254448 | A1 * | 11/2007 | Bhatt et al. .................. 438/381 |

(Continued)

FOREIGN PATENT DOCUMENTS

DE       102 49 192  A1    10/2002

(Continued)

OTHER PUBLICATIONS

German Office Action dated Nov. 27, 2008 with English translation (4 pgs).

(Continued)

*Primary Examiner*—Alexander O Williams
(74) *Attorney, Agent, or Firm*—Brinks Hofer Gilson & Lione

(57) ABSTRACT

An integrated circuit arrangement is disclosed. In one embodiment, the integrated circuit arrangement includes at least three conductive structures levels and elongated interconnects.

19 Claims, 3 Drawing Sheets

U.S. PATENT DOCUMENTS

2008/0070339 A1*  3/2008  Power et al. .................. 438/48
2008/0100408 A1*  5/2008  Chen ........................ 336/200
2008/0224318 A1*  9/2008  Hommel et al. ............ 257/758

FOREIGN PATENT DOCUMENTS

EP        0 905 778 A2    3/1999

OTHER PUBLICATIONS

Patent Search Report of Application No. 095134498 (1 sheet).

Office Action dated Mar. 12, 2009, for U.S. Appl. No. 11/525,111 (7 sheets).

* cited by examiner

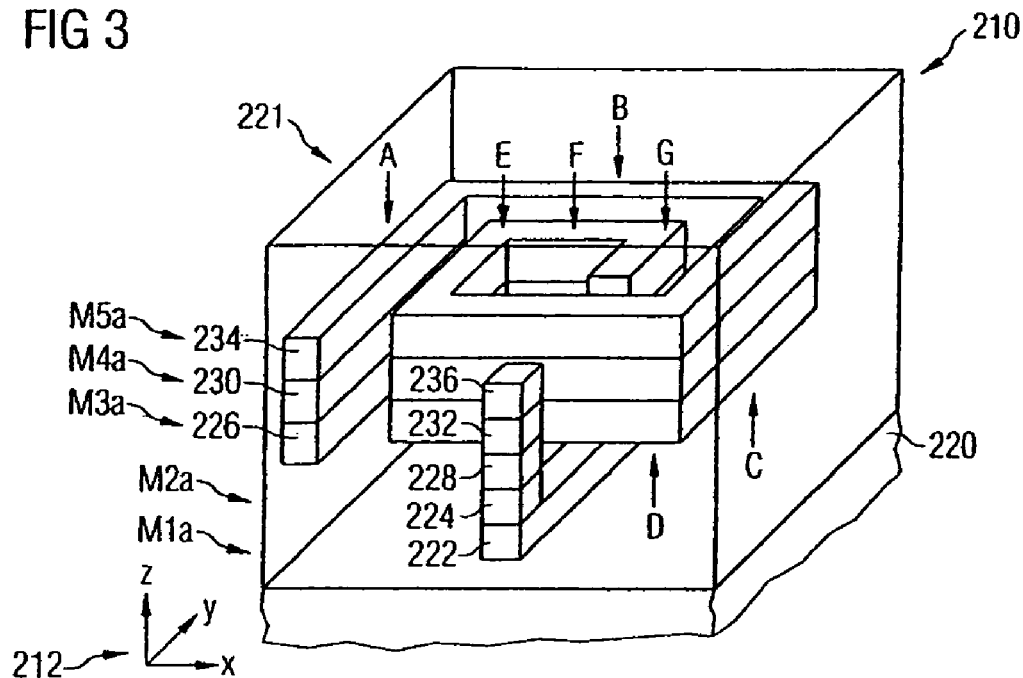
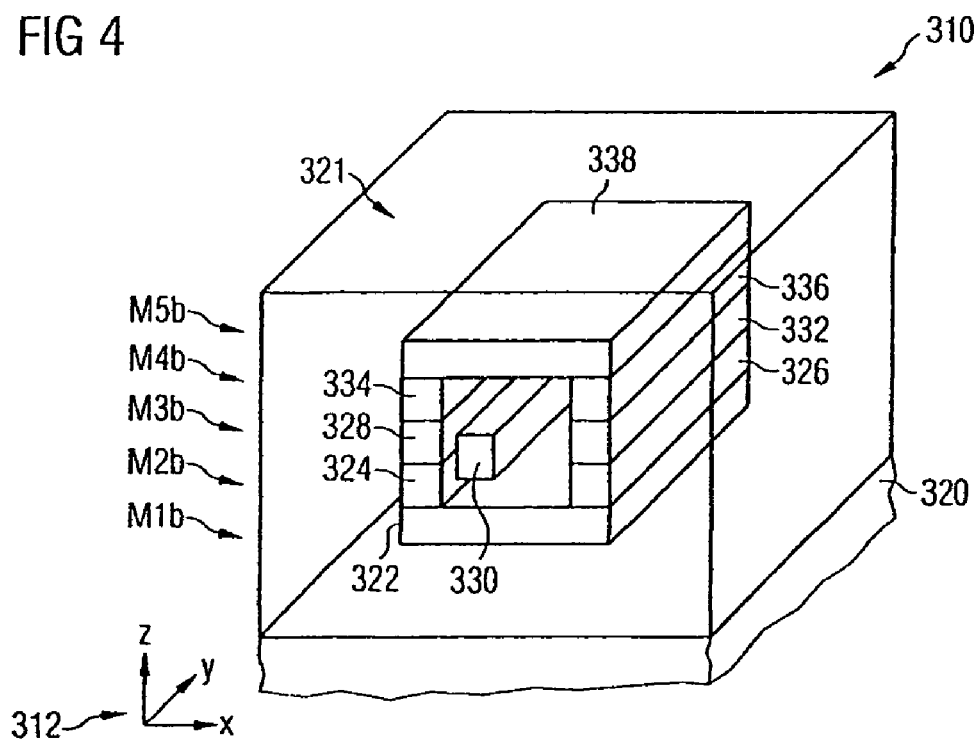

INTEGRATED CIRCUIT WITH IMPROVED COMPONENT INTERCONNECTIONS

RELATED APPLICATIONS

The present application claims priority to German Patent Application Serial Number DE 10 2005 045 059.8, filed Sep. 21, 2005, the entirety of which is hereby incorporated herein by reference.

SUMMARY

The invention relates to an integrated circuit arrangement having a coil. For example there is an integrated circuit arrangement having a substrate and having at least three directly successive conductive structure levels. The substrate is, in particular, a monocrystalline semiconductor substrate or a so-called SOI substrate (silicon on insulator). The conductive structure levels are also referred to as metalization levels because the conductive structures which they contain usually comprise a metal or a metal alloy, for example an aluminum alloy with an aluminum proportion of greater than 60 atomic per cent or greater than 90 atomic per cent of aluminum, or a copper alloy with a copper proportion of greater than 60 atomic per cent or greater than 90 atomic per cent. However, other materials are also suitable for the conductive structures, for example doped semiconductor material.

In the case of the conductive structures distinction, can be made between interconnects for lateral current transport and so-called vias or contacts serving for vertical current transport. In this case, vertical denotes a direction lying in the direction of the normal to a main area of the substrate in which integrated semiconductor components are also arranged. Alternatively, vertical means a direction opposite to the direction of the normal. Lateral means in a direction lying transversely or at an angle of 90° with respect to the direction of the normal.

The conductive structure levels each contain a multiplicity of conductive structures arranged in a level or a plane. Thus, modern planarization methods, such as the CMP method (chemical mechanical polishing), for example, produce essentially planar interfaces between the conductive structure levels. However, the designation of a conductive structure level may also be employed when the planarization is not completely planar in the context of the production tolerances. The individual levels can be distinguished from one another by other structural features, for example by particular interlayers between conductive structure levels or by specific distances between the level bottom areas and the substrate main area. In this case, the differences in the specific distances for different levels are at least twice as great or at least three times as great as the manufacturing tolerances for the spatial position of the bottom areas of the conductive structure level in which the interconnects with said bottom areas are arranged.

The conductive structures each contain at least one bottom area near to the substrate and a top area remote from the substrate. A direction of the normal to the bottom area lies counter to the direction of the normal to the substrate main area. A direction of the normal to the top area lies in the direction of the direction of the normal to the substrate main area, that is to say the area containing the semiconductor components, for example transistors.

The top areas of the conductive structures of one of the conductive structure levels in each case lie in a level top area of the conductive structure level. The level top area is a plane, for example. The bottom areas of the conductive structures of one of the conductive structure levels in each case lie in a level bottom area of the conductive structure level. The level bottom area is likewise a planar area, for example. Deviations from a planar level top area or a planar level bottom area arise for example as a result of the intermeshing of conductive structures of adjacent conductive structure levels.

Between the level top area and the level bottom area of a conductive structure level there is, for example, no intermediate area in which top areas or bottom areas of conductive structures of said conductive structure level are arranged. Accordingly, conductive structures produced by means of the dual damascene technique, in particular, are arranged in different conductive structure levels. In addition, conductive structure levels are produced by using the single damascene method or a so-called subtractive method, in which electrically conductive material is removed again during patterning from the conductive structure level to be produced, such as an RIE method (reactive ion etching), for example.

The levels or planes in which the conductive structures of a respective conductive structure level are arranged preferably lie parallel to the substrate main area and thus also parallel to one another.

What is typical of known metalizations or wirings is the alternative use of a via level, exclusively containing vias, and an interconnect level, containing interconnects and, if appropriate, also vias or so-called landing pads. This arrangement is exclusively used in particular in inner conductive structure levels of the circuit arrangements.

It is an object of the invention to specify an integrated circuit arrangement having a metalization which has improved electrical properties and which, in particular, opens up novel application possibilities, e.g. the production of passive components having particularly good electrical properties. In addition, the intention is to specify a production method.

In the case of the circuit arrangement, there are at least three directly successive conductive structure levels, each of the three conductive structure levels containing at least one wiring interconnect or a multiplicity of wiring interconnects. In one configuration, a wiring interconnect in each case has a length that is at least five times greater than the width of the interconnect. Both the length and the width of the interconnect are measured in the lateral direction. If the interconnect has different widths along its course, then the minimum width of the interconnect at one of its sections is chosen as a reference width, for example.

A current flows through the wiring interconnects during operation of the integrated circuit arrangement, with the result that they differ from filler structures or other auxiliary structures of the integrated circuit arrangement.

Therefore, the circuit arrangement does not exhibit a via level arranged between two wiring interconnect levels. In this way, coils having a high quality factor, capacitors having a low contact resistance, operating voltage lines having a low nonreactive resistance, coaxial lines and other passive components can be produced in a simple manner if interconnects of adjacent conductive structure levels are arranged in a manner adjoining one another along their entire length or in a relatively long section, for example in a section having a length that is ten times greater than the width of the section.

Moreover, in one configuration, the wiring has outstanding electrical properties if the three metalization levels each contain interconnects which adjoin conductive structures of other metalization levels only at short sections in comparison with their total length, e.g. only at their ends. In this case, short means e.g. less than a third or even less than a tenth of the total length of the interconnect in the relevant conductive structure level. Lying between the sections is a section that adjoins dielectric on all sides.

In the configuration, the middle one of the three conductive structure levels contains a middle wiring interconnect. That conductive structure level from among the three conductive structure levels which is the most remote from the substrate contains a wiring interconnect remote from the substrate.

That conductive structure level from among the three conductive structure levels which is nearest to the substrate contains a wiring interconnect near to the substrate. The middle wiring interconnect, the wiring interconnect remote from the substrate and the wiring interconnect near to the substrate each have a section whose top area and whose bottom area do not adjoin a conductive structure of another metalization level. The section has a length amounting to at least the width or double the width of the section, but preferably even ten times or even fifty times the width of the section. One of the following arrangements is in each case provided at said wiring interconnects:

the wiring interconnect is adjoined by only at least two conductive structures of the conductive structure level arranged directly below the relevant conductive structure level, but not by any conductive structures of the overlying conductive structure level, the wiring interconnect is adjoined by only at least two conductive structures of the conductive structure level arranged directly above, but not by any conductive structures of the underlying conductive structure level, the wiring interconnect is adjoined by at least one conductive structure of the conductive structure level arranged directly underneath and by at least one conductive structure of the conductive structure level arranged directly above.

All three possibilities involve wiring interconnects which each have a length amounting to at least five times their minimum width. In configurations, the wiring interconnects extend in the same directions. In further exemplary embodiments, one interconnect extends transversely with respect to the other two of the three interconnects, e.g. in the x direction, while the other two interconnects extend in the y direction. The interconnect extending in the other direction is, for example, the lower, the middle or the upper one of the three interconnects.

In a next configuration, the middle wiring interconnect adjoins the wiring interconnect remote from the substrate and the wiring interconnect near to the substrate at contact areas. The contact areas are arranged with a lateral offset with respect to one another. Situated between the contact areas is a section of the middle wiring interconnect which has a top area that adjoins neither the wiring interconnect remote from the substrate nor some other conductive structure remote from the substrate. The section of the middle wiring interconnect has a bottom area that adjoins neither the wiring interconnect near to the substrate nor some other conductive structure. The section of the middle wiring interconnect has a length amounting to at least the width or double the width of the section, preferably more than ten times said width. Without the use of vias, it is thus possible to ensure, in a simple manner, current transport both in a vertical direction and a lateral direction from the wiring interconnect near to the substrate by way of the first middle interconnect through to the wiring interconnect remote from the substrate, or in the opposite direction.

In another development, the middle one of the three conductive structure levels contains at least one middle component interconnect in addition to the middle wiring interconnect. That conductive structure level from among the three conductive structure levels which is the most remote from the substrate contains at least one component interconnect remote from the substrate in addition to the wiring interconnect remote from the substrate. That conductive structure level from among the three conductive structure levels which is the nearest to the substrate contains at least one component interconnect near to the substrate in addition to the wiring interconnect near to the substrate. The middle component interconnect adjoins the component interconnect remote from the substrate in a component section. At the component section the middle component interconnect additionally adjoins the component interconnect near to the substrate. The component section has a length amounting to at least four times or at least ten times or even fifty times the width of the component section, e.g. the minimum width. With such structures it is possible to produce passive components in a simple manner, in particular coils having a high quality factor, coaxial lines or else lines having a low nonreactive resistance on account of the large line cross section of the interconnects routed parallel to one another, and also vertical capacitors.

For cost and process reasons, the damascene architecture permits only limited track cross sections (width limit as a result of so-called dishing, thickness limit for cost- and process-technological reasons). Owing to this and because interconnect planes have hitherto been connected by means of discrete vias, the attainable physical parameters, e.g. the quality factor of coil, were not as good as when using the invention or one of its developments.

In a next development, the conductive structures of each of the three conductive structure levels each comprise aluminum or at least 60 atomic per cent of aluminum. In an alternative development, the conductive structures of the three conductive structure levels each comprise copper or at least 60 atomic per cent of copper. The metalization is thereby fabricated from materials whose processing is well mastered from a technological standpoint.

In another development of the circuit arrangement according to the invention, the three conductive structure levels are inner conductive structure levels of the circuit arrangement. This development overcomes the prejudice that in the case of inner conductive structure levels, via levels and interconnect levels have to alternate in order to ensure a wiring having good electrical properties, in particular having a small RC product.

In a next development, still further conductive structure levels, in which via levels and interconnects alternate, for example, are arranged between that conductive structure level from among the three conductive structure levels which is nearest to the substrate and the substrate. However, the lower conductive structure levels can also be embodied as levels which also each contain both vias and interconnects.

The invention additionally relates to a method for producing the circuit arrangement according to the invention or one of its developments. In one embodiment of the method, the three conductive structure levels are each produced by means of a single damascene method. In a single damascene method, after the deposition of one or more electrically insulating layers for taking up the conductive structures of the respective conductive structure level, in contrast to a dual damascene method with two photolithographic methods, only a single photolithographic method is used for patterning the insulating layer or the insulating layers. In contrast to a dual damascene method, the single damascene method can be carried out with a higher yield.

The invention additionally relates to an integrated circuit arrangement having an integrated coil, an integrated circuit arrangement having an integrated coaxial line and an integrated circuit arrangement having a capacitor. These passive components may also be contained in conventional metalization levels in which via levels and interconnect levels alternate. As an alternative, however, such a passive component is integrated together with a circuit arrangement explained above on a substrate, in particular on a monocrystalline substrate, e.g. in a plurality of successive interconnect levels or below or above a plurality of successive interconnect levels.

The invention or its developments therefore propose a design change that can be implemented from a process-technological standpoint with a great effect on the aspects of "reducing the interconnect resistances", "meeting the rising current-carrying capacity requirements", "supporting the heat dissipation", "realizing coils having a very high quality factor", and "realizing vertical capacitors".

The solution according to the invention or its developments may provide a wiring in which the discrete vias of the standard metalization that serve exclusively for vertical current transport are partly or wholly obviated and replaced by interconnect planes in single damascene architecture. This means that each metal layer can carry current vertically and laterally within this plane.

The invention or its developments can be used in all semiconductor technologies with damascene wiring architecture (e.g. copper metalization, aluminum metalization, tungsten metalization). In principle, however, it can also be realized with subtractive architectures (e.g. AL-RIE reactive ion etching).

TECHNICAL EFFECTS

The invention or its developments make it possible, in different planes, to realize interconnects having a significantly larger cross section and—owing to this and on account of the discrete vias being obviated—lower resistance. Various further technical effects are derived from this:

in general, higher currents and/or longer service lives and/or higher operating temperatures, e.g. important for so-called automotive applications, may be made possible in comparison with the standard metalization.

"Joule Heating", that is to say the heating of interconnects as a result of high operating currents and poor heat dissipation, is significantly reduced since, for the same current, the current density owing to the increased track cross section and thus the heating turn out to be lower. Even in the 90 nm technology, primarily in insulated power bus interconnects, the "Joule heating criterion" limits the useable current density to a greater extent than the pure DC criterion (direct current).

In general, higher current densities are possible. In the metalization in accordance with the prior art, the maximum useable current density is often limited by the current-carrying capacity of the vias or the via/interconnect contact areas. In the solution according to the invention, the contact areas between planes can be chosen as desired.

The effect of the "size" effect, according to which the resistivity of copper interconnects increases greatly at dimensions of less than 100 nanometers, that is to say which is manifested especially in the lower planes with a minimum width, can be significantly reduced by the invention or its developments. This means that the RC element especially in these planes rises to a lesser extent than in the standard architecture and the introduction of mechanically unstable "ultra-low k" dielectrics or even air gaps can be postponed or entirely avoided.

The invention or its developments make it possible to realize novel integrated components or passive components having physical quality factors that have not been achieved heretofore:

with very thick metal layers by doubling or tripling the previous interconnect plane, it is possible to produce coils having a very high quality factor, in particular having a low series resistance, provision of large-area capacitances having high quality factors by virtue of low series and contact resistances on an inter- and intralevel basis, the realization of perfectly shielded coaxial lines or RF transmission interconnects (radio frequency), e.g. greater than 1 megahertz or greater than 1 gigahertz, becomes reliably possible for the first time.

The invention or its developments permit a more dependable and more cost-effective process implementation in comparison with the prior art:

the invention or its developments lead in the extreme case to a construction which can be realized exclusively in single damascene architecture. It thus comprises a single, multiply repeated module requiring only few manufacturing installations.

The critical and yield-limiting processes, e.g. via etching, cleaning, filling with a high aspect ratio; high inspection and rework rate, are obviated at the locations or in the planes where use is made of the invention or its developments wholly or partly. Higher yields mean lower costs per chip.

The total number of wiring planes can be reduced, which likewise leads to lower costs.

Higher packing density within the metalization can be attained since larger contact areas than heretofore are made possible. For this reason, a bias (overlap) that adversely effects the packing density is not required in order to ensure a minimum contact area.

The requirement for "redundant" vias, which is often imposed in the prior art for the purpose of safeguarding higher current densities or for the purpose of increasing the yield, can be realized significantly more easily and more simply, that is to say in particular also without an additional increase in area, if the fewest possible discrete vias with minimum dimensions in the x and y directions are used.

The invention or its developments permit the cross-sectional enlargement of interconnects by enlargement of the vertical dimension and this is associated with a saving of area since lateral dimensions can be reduced.

The invention or its developments enable greater degrees of freedom and options in terms of the design.

They may optionally be combined with the architecture in accordance with the prior art (e.g. lower interconnects of minimal width in accordance with conventional architecture; higher, global interconnects in accordance with the novel architecture).

The lateral dimensions of the interconnects in the "former" discrete via plane can be chosen in a continuously variable manner and arbitrarily within the context of the (damascene) design rules.

With the invention or its developments it is possible to satisfy different requirements of combined or embedded technologies, e.g. "thick" and "thin" wiring in BiCMOS technologies (Bipolar Complementary Metal Oxide Semiconductor).

The invention or its developments enable the current distribution over the chip to be configured better and more uniformly.

Owing to the lower interconnect resistance in comparison with the prior art, the power loss is lower and the number of "repeaters" required in the design is decreased.

The invention or its developments do not adversely effect the RC element (resistance, capacitance) in the interconnects that are increasingly limiting the overall performance. What is important is that the invention or its developments afford a technological solution that has not been available heretofore for reducing the resistance of interconnects without simultaneously increasing the area requirement for the wiring and the vertical coupling between interconnects.

A closer consideration even shows positive effects of the invention or its developments on the RC element, e.g. the factor C does not increase directly proportionally to the interconnect thickness, but rather to a lesser extent, and the resulting product RC thus even becomes smaller. The reduction of the "size" effect also leads to a small RC product.

In the case of local wiring, moreover, often it is not the line capacitance that is predominant, but rather the capacitance to be driven, e.g. the gate capacitance of MOS transistors, with the result that the decrease in the resistance and hence in the RC product proportionally to 1/d remains as a positive effect, where d is the total interconnect thickness over one metalization level or, in the case of interconnect doubling or tripling, over a plurality of metalization levels.

This can be utilized not only in the case of a manually optimized "full custom" layout, but also—using the wiring concepts that are customary nowadays—in the synthetized "semi custom" blocks. It is thus possible to realize e.g. 11 metal levels depending on requirements on the same chip either by means of 6 single interconnect planes and 5 via planes (in less performance-critical blocks) or by means of 4 double interconnect planes and 3 via planes (in performance-critical blocks).

A wiring is thereby specified in which, in all or in selected planes, the discrete vias of the standard metalization that serve predominantly for vertical current transport are partly or wholly obviated and replaced by interconnect planes. This means that the relevant metal levels can carry current vertically and laterally within this level or plane.

To summarize, it holds true that the invention or its developments relate to reducing or solving the following technical problems:

preventing a wiring that becomes evermore complicated or the so-called "wiring catastrophe" in future large scale integrated semiconductor systems, reducing the wiring resistance, particularly in the case of voltage supply lines (power routing) and inductances, reducing the RC element, e.g. in the case of bus systems, reducing instances of coupling and crosstalk by shielding critical lines, in particular by 3D (three-dimensional) wiring, e.g. coaxial, and RF interconnects, reducing the power loss and heating of the components or integrated circuit arrangements, in particular with the use of "low-k dielectrics" having relative permittivities of less than 3.9 or less than 3, reducing the so-called "size effects" in future wirings, according to which the nonreactive resistance of copper interconnects rises to an extent greater than expected purely by virtue of the scaling as early as from the 90 nm (nanometers) technology.

Reducing the reliability losses, particularly brought about by current density-/resistance-critical interconnect/via transitions, losses of yield and complicated process implementation with narrow "process windows", in particular by reducing the required number of yield-limiting vias and using the less demanding "single damascene architecture".

BRIEF DESCRIPTION OF THE DRAWINGS

Exemplary embodiments of the invention are explained below with reference to the accompanying drawings, in which:

FIG. 3 shows a coil or inductance arranged in a metalization, FIG. 4 shows an integrated coaxial line arranged in a metalization.

DETAILED DESCRIPTION OF THE DRAWINGS

Figure 1:
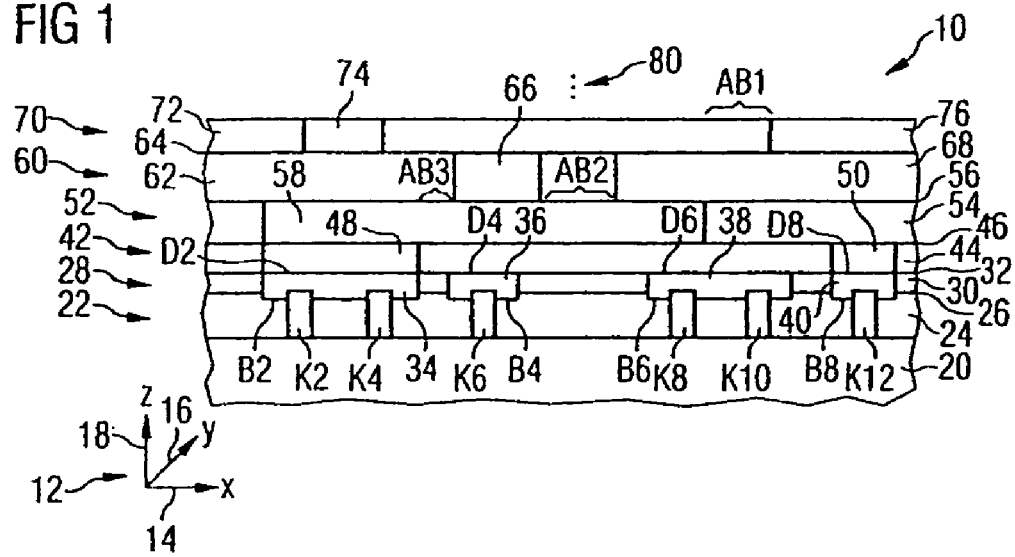
FIG. 1 shows a cross section through the metalization of one embodiment of an integrated circuit arrangement.

FIG. 1 shows a cross section through the metalization of an integrated circuit arrangement 10. The cross section lies in a plane in which the direction of the normal to the main area of a substrate 20 lies too, the substrate including a multiplicity of integrated components, for example integrated bipolar transistors or field effect transistors.

A system of Cartesian coordinates 12 has an x axis 14, a y axis 16 and a z axis 18. The cross section shown in FIG. 1 lies in the x-z plane. By contrast, the main area of the substrate 20 lies in the x-y plane. In connection with FIGS. 2 to 6, systems of coordinates 112, 212, 312, 412 and 512, respectively, are shown and the statements made with regard to the system of coordinates 12 hold true for the position of said systems of coordinates.

Directly above the substrate 20, the circuit arrangement 10 contains a contact level 22 containing contacts K2, K4, K6, K8, K10 and K12, inter alia. The contacts K2 to K12 serve for vertical current transport. By way of example, the contacts K2 to K12 are formed from tungsten including an electrically conductive lining layer made of a different material than tungsten. The contacts K2 to K12 all have the same lateral dimensions.

During the production of the contact level 22, an insulating layer 24, such as silicon dioxide, that is electrically insulating is applied. Contact holes for the contacts K2 to K12 are etched into the insulating layer 24 with the aid of a photolithographic method. The material for lining the contact holes is subsequently deposited. This is followed by the deposition of the metalization for the contacts K2 to K12. A CMP step, for example, is subsequently carried out, during which that material of the lining layer and contact material which lies outside the contact holes for the contacts K2 to K12 is removed. After the planarization, an electrically insulating auxiliary layer 26 is deposited, which is thin in comparison with the thickness of the insulating layer 24. By way of example, the thickness of the insulating layer 24 may lie within the range of 100 nm to 500 nm. The thickness of the auxiliary layer 26 may lie within the range of 30 nm to 70 nm, for example. The auxiliary layer 26 serves as an etching stop layer and/or as a barrier layer against copper diffusion. A suitable material for the auxiliary layer 26 is silicon nitride, for example.

The deposition of the auxiliary layer 26 is followed by the deposition of an insulating layer 30 made of an electrically insulating material having a layer thickness lying within the range of 200 nm to 500 nm, for example. A photolithographic method is used to produce trenches and cutouts or holes for conductive structures of a metalization level 28, which is also designated as metalization level 1 hereinafter. The conductive structures in the metalization level 28 have mutually different dimensions in the x direction. Moreover, the conductive structures also have mutually different dimensions in the y direction. During the etching of the trenches and cutouts for the conductive structures of the metalization level 28, the auxiliary layer 26 is perforated because a degree of overetching is effected. Local interconnects 34, 36 and 38 and also a via 40 are then produced, inter alia, in the customary damascene technique. The interconnect 34 extends in the x direction and connects the contacts K2 and K4. By contrast, the interconnect 36 extends in the y direction and serves for connecting the contact K6 to a conductive structure (not illustrated) or to a contact (not illustrated) of the contact level 22. The interconnect 38 extends in the x direction and connects the contacts K8 and K10. The interconnects 34, 36 and 38 have for example a minimum lateral width within the range of 80 nm to 200 nm. The length of the interconnects 34, 36 and 38 is in each case greater than 500 nm (nanometers), for example, but less than 1 μm (micrometer), and in particular less than 10 μm.

By contrast, the via 40 has the same lateral dimension in the x direction and in the y direction and serves for connecting the contact 12 to an interconnect of a metalization level 42 arranged above the metalization level 28. Prior to the production of the metalization level 42, planarization is once again effected with the aid of a CMP step.

FIG. 1 additionally shows bottom areas B2, B4, B6 and B8 and also top areas D2, D4, D6 and D8 of the interconnects 34, 36, 38 and the via 40, respectively. The top areas D2 to D8 lie in one plane in the exemplary embodiment. By contrast, the bottom areas B2 to B8 lie in two planes on account of the better intermeshing of the contact level 22 in the metalization level 28, but the distance between the two planes is less than 50 nm, and in particular less than 20 nm. The metalization levels 22 and 28 intermesh within said distance.

After the CMP step, an auxiliary layer 32 is deposited, for the material composition and thickness of which the statements made with regard to the auxiliary layer 26 hold true. After the deposition of the auxiliary layer 32, a further insulating layer 44 that is electrically insulating is deposited, which, in the exemplary embodiment, is thicker than the insulating layer 30, for example by at least 50 nm. Interconnects 48 and 50 of the metalization level 42 are produced, inter alia, in the insulating layer 44 with the aid of a single damascene method. In addition, the metalization level 42 also contains vias (not illustrated). The conductive structures 48, 50—in the same way, incidentally, as the conductive structures 34 to 40—are lined with a lining layer which is a copper diffusion barrier, for example with a tantalum nitride layer. The interconnect 48 extends in the x direction and has, apart from processing tolerances, the same length as the interconnect 34. Consequently, the interconnect 48 serves for vertical current transport between the interconnect 34 and a conductive structure of the next higher metalization level 52 that is arranged above the interconnect 48, and also for lateral current transport between the contacts K3 and K4. The interconnect 50 extends in the y direction and serves for the connection of the via 40.

After a CMP step, an auxiliary layer 46 is once again deposited, for the material composition and thickness of which the statements made with regard to the auxiliary layer 26 hold true. An insulating layer 54 that is electrically insulating is subsequently deposited, which has for example the same thickness as the insulating layer 44 or a thickness greater by 50 nm than the thickness of the insulating layer 44. Cutouts for interconnects and vias are produced in the insulating layer 54 with the aid of a single damascene method, see for example the cutout for an interconnect 58. After an electrolytic copper deposition, a CMP step once again follows.

An electrically insulating auxiliary layer 56 is subsequently applied, for the material constitution and thickness of which the statements made with regard to the auxiliary layer 26 hold true.

An insulating layer 62 of a metalization level 60 that is electrically insulating is then applied, in which both vias and interconnects, e.g. 66, 68, are produced. The conductive structures of the metalization level 60 are likewise produced with the aid of a single damascene method.

After the next CMP step, an auxiliary layer 64 is applied, for which the statements made with regard to the auxiliary layer 26 hold true. An insulating layer 72 is then applied, in which conductive structures 74 and 76 of a metalization level 70 are produced. Further metalization levels 80 are indicated by dots.

The interconnect 58 runs in the x direction and adjoins the interconnect 48 by its left-hand end. A middle part of the interconnect 58 adjoins the interconnect 66. The right-hand end of the interconnect 58 adjoins the interconnect 68 running in the x direction.

The interconnect 74 runs in the y direction. The interconnect 76 runs in the x direction and adjoins a right-hand part of the interconnect 68 by its left-hand end. Sections AB1 to AB3 of the interconnect 68 and respectively of the interconnect 58 do not adjoin any further conductive structures. The sections AB1, AB2 and AB3 each have a length amounting to at least five times the width of the interconnect 58 and 68, respectively.

Consequently, the contact level 22 and also the metalization levels 28, 42, 52, 60, 70, 80 lie parallel to the main area of the substrate 20 in x-y planes.

Figure 2:
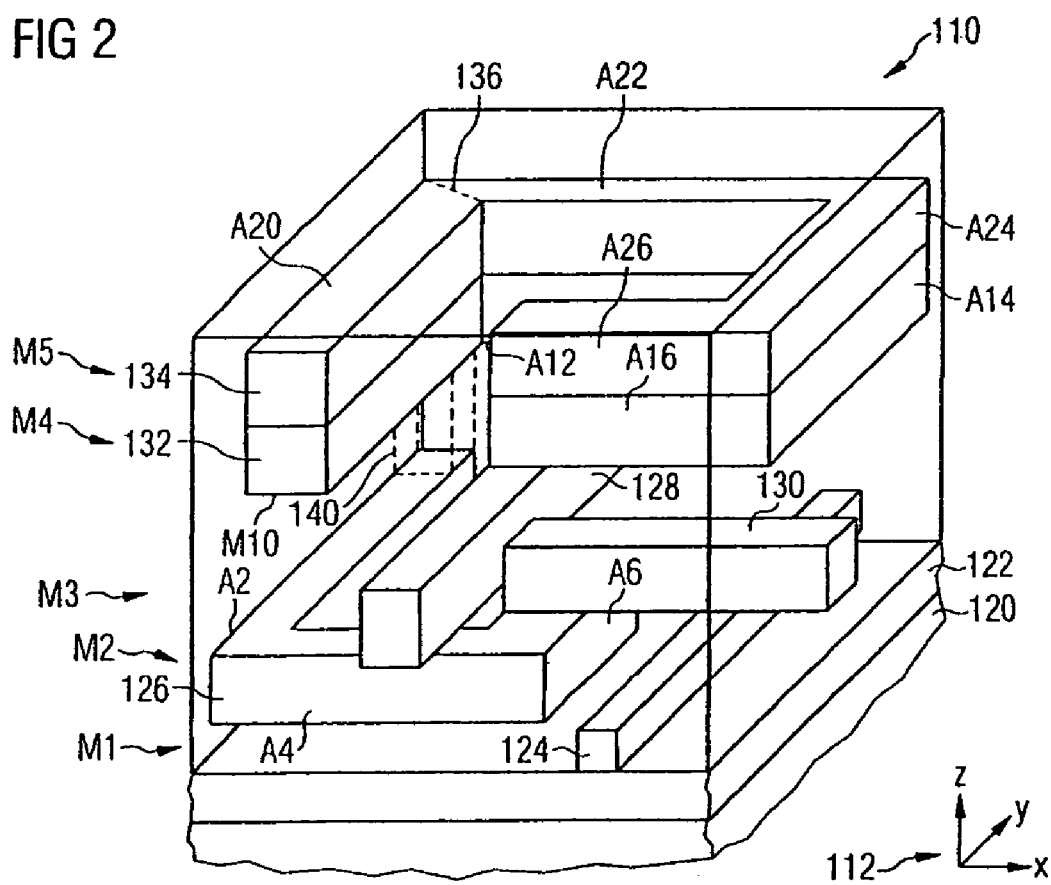
FIG. 2 shows a three-dimensional view of the metalization of one embodiment of an integrated circuit arrangement.

FIG. 2 shows a three-dimensional view of the metalization of an integrated circuit arrangement 110, which, like the circuit arrangement 10, contains a plurality of successive interconnect levels M1 to M5. The conductive structures of the circuit arrangement 110 are likewise produced using single damascene technology, with the result that reference is made to the explanations in this regard concerning FIG. 1.

The circuit arrangement 110 likewise contains a semiconductor substrate 120, for example made of monocrystalline silicon. A contact level 122, which is constructed like the contact level 22, for example, is situated between a semiconductor substrate 120 and a first metalization level illustrated in FIG. 2. An interconnect 124 running in the y direction is illustrated in the overlying metalization level M1. An interconnect 126 is arranged, inter alia, in a metalization level M2 arranged above the metalization level M1, said interconnect having three successive sections A2, A4 and A6, the two sections A2 and A6 lying in the y direction. The section A4 connects the sections A2 and A6 at their ends and runs in the x direction. The section A6 is for example longer than the section A2.

Two interconnects 128 and 130 are illustrated in a metalization level M3 arranged above the metalization level M2. The interconnect 128 extends in the y direction from a middle part of the section A4 which it adjoins, too. By contrast, the interconnect 130 extends in the x direction proceeding from the free end of the section A6 which it adjoins, too. By way of example, the metalization level M3 also contains a via 140 at the free end of the section A2 in place of the interconnect 128.

The metalization level M4 contains an interconnect 132 containing sections A10, A12, A14 and A16 which lie in the order: in the y direction, in the x direction, in the y direction and in the x direction, forming approximately ¾ of a rectangular or square frame. The section A16 adjoins the interconnect 128. As an alternative, the via 140 adjoins the section A10.

An interconnect 134 is illustrated in the metalization level M5 arranged above the metalization level M4, said interconnect containing sections A20, A22, A24 and A26 in that order. The sections A20 to A26 in the metalization level M4 have the same position as the sections A10 to A16 in the metalization level M3, an identical x, y position in both levels serving as reference point. Consequently, by way of example, the section A20 lies directly above the section A10 and adjoins said section A10 along its entire length. The interconnects 132 and 134 thus form a so-called "double" interconnect, the line cross section of which is enlarged, e.g. doubled, in comparison with the cross section of an interconnect 132 or 134. In other exemplary embodiments, use is also made of interconnects arranged triply or more than triply one above another, for example for lines via which high currents flow, in particular for supply voltage lines.

As boundary between the sections of an interconnect, it is possible for example to define the connecting area between inner and outer edges at a location at which the interconnect changes its course, see auxiliary line 136, for example. Length indications then relate for example to an average length at said auxiliary line 136.

All the metalization levels M1 to M5 additionally contain e.g. via conductive structures (not illustrated) which serve only for vertical current transport and which have the same dimension for example in the x direction and y direction. As an alternative, there are no vias present in the metalization levels M1 to M5.

FIGS. 1 and 2 show the solution schematically. The selection of the planes in which the invention is implemented can be made individually depending on technology, necessity, requirements and components to be integrated. The application is preferably effected in one or a plurality of levels of the "global interconnects", e.g. in power rails or power grids (digital circuit blocks), power bus lines, ESD buses (electrostatic discharge) (analog/mixed signal circuit blocks), 3D wiring (coaxial), inductances, RF interconnects (radio frequency), etc. However, it can also be used in the case of "local interconnects", e.g. connections of ESD protection elements (electrostatic discharge), and is useful therein from specific standpoints.

FIG. 3 shows a coil 221 or inductance arranged in a metalization of an integrated circuit arrangement 210. Firstly, process steps for the production of microelectronic devices on a substrate 220, such as e.g. Si wafers, are carried out for the production of the circuit arrangement 210. Contacts (not illustrated) of a contact level are then produced. A metalization level M1a and a metalization level M2a are subsequently produced, e.g. by means of two single damascene methods performed one after the other. FIG. 3 illustrates an interconnect 222 of the metalization level M1a, which is oriented in the y direction and which forms a feed line to the coil 221.

The metalization level M2a contains a via 224, inter alia, which adjoins one end of the interconnect 222. An interconnect (not illustrated in FIG. 3) of the metalization level M2a lies between the other end of the interconnect 222 and the winding of the coil 221.

A next metalization level M3a is produced e.g. in single damascene (SD) architecture by deposition of an IMD layer (intermetal dielectric), e.g. made of $SiO_2$ or low-k material, and optional etch stop, ARC (antireflection coating) and hard mask layers by means of the methods explained with reference to FIG. 1. Trenches are then produced for an interconnect 226 by means of customary resist coating, lithography, etching stripping and cleaning steps. The trenches have e.g. a depth in the range of from 0.5 micrometer to 2 micrometers. The width of the trenches lies e.g. in the same range. The known deposition of barrier and interconnect material and also subsequent CMP and cleaning steps and also deposition of a dielectric cap layer end the production of the metalization level M3a in SD architecture with relaxed geometry. The inner end of the interconnect 226 adjoins the interconnect—concealed by the coil turns in FIG. 3—of the coil 221 in the metalization level M2a. Moreover, in the metalization level M3a, a via 228 is produced at the same position as the via 224 in the metalization level M2a.

A metalization level M4a replaces a plane or level with discrete vias at this location. The lateral dimensions of the fourth metalization level M4a are adapted to those of the metalization level M3a at the location of the coil to be produced, and at other locations they can be chosen arbitrarily (in the context of the design rules). The trench depth in turn lies within the range specified above. The sequence of the production steps for the metalization level M4a in SD architecture essentially corresponds to the description for the metalization level M3a. An interconnect 230 is produced in the metalization level M4a, said interconnect having the same course as the interconnect 226 and adjoining the interconnect 226 over its entire course. Furthermore, the metalization level M4a contains a via 232 above the via 228.

Using the modular construction, a metalization level M5a is produced by means of the same process steps likewise in SD architecture. The dimensions are analogous to the steps previously. An interconnect 234 is produced in this case, which interconnect has the same course as the interconnect 230 in the region of the coil 221 and additionally forms the other connection of the coil 221. The metalization level M5a additionally contains a via 236 arranged above the via 232.

As can be seen in FIG. 3, an integrated coil 221 was thus produced which has e.g. a winding height within the range of 1.5 micrometers to 6 micrometers such as can be realized only with difficulty and with high cost expenditure in traditional dual damascene architecture. The winding cross section, that is to say the width times the height, is significantly larger than in the case of a comparable component in standard architecture. In concrete terms, the height of the winding amounts to triple, but at least one and a half times, that of a comparable coil in standard architecture. This means that with otherwise identical dimensions it enables significantly higher physical quality factor values than the reference coil. As an alternative, a coil having a quality factor comparable to the standard could be obtained through smaller lateral dimensions with the architecture according to the invention, which would entail significant area savings. The feed and outgoing routing of the connections is effected e.g. in the topmost, i.e. here in the metalization level M5a, or in the lower (here first) level with the aid of an "underpass".

The coil 221 has 1¾ turns formed by successive sections A, B, C, D, E, F and G of the triple interconnect 226, 230 and 234. The sections A, C, E and G extend in the y direction and have decreasing lengths in the order stated. By contrast, the sections B, D and F extend in the x direction and have lengths that likewise decrease in said order. The width of the interconnects 226, 230 and 243 lies e.g. in the range of from 1 micrometer to 10 micrometers. The length of the interconnect 226, 230 or 243 in each case lies e.g. in the range of from 10 micrometers to 500 micrometers.

The further processing and completion of the circuit are effected by means of the customary methods and processes.

In other exemplary embodiments, the coil 221 lies in other metalization levels or the winding lies only in two, four or more than four metalization levels.

FIG. 4 shows a coaxial line 321 arranged in a metalization of an integrated circuit arrangement 310. Firstly, process steps for the production of microelectronic components on a substrate 320, such as e.g. silicon wafer are performed. This is followed by the production of contacts (not illustrated in FIG. 4) and a metallic metalization level M1b by means of the known procedures in the art. At the location of the coaxial line 321, an interconnect 322 forming the baseplate of the coaxial line 321 and having a rectangular contour is made particularly wide, e.g. with a width within the range of 10 micrometers to 20 micrometers, in particular with a width of 14 μm.

This is followed by the production of a metalization level M2b in single damascene (SD) architecture by deposition of an IMD layer ($SiO_2$ or low-k material) and optional etch stop, ARC and hard mask layers by means of customary methods. This is furthermore followed by the production of the trenches e.g. having the abovementioned dimensions by means of customary resist coating, lithography, etching, stripping and cleaning steps. The known deposition of barrier and interconnect material and also subsequent CMP and cleaning steps and also deposition of a dielectric cap end the production of the metalization level M2b in SD architecture with relaxed geometry. At the location of the coaxial line, the width of the second metal level with e.g. 2 μm is significantly smaller than that of the lower level. Two interconnects 324, 326 in the metalization level M2b terminate e.g. flush with the longitudinal sides of the interconnect 322.

Using the modular construction, a metalization level M3b is produced by means of the same process steps likewise in SD architecture. The position, length and width of interconnects 328 and 332 match the values chosen in the metalization level M2b for the interconnects 324 and 326, respectively. In addition, in the mask for the metalization level M3b, a further interconnect 330 having a width of 2 μm, for example, is provided and produced in the course of processing. The interconnect 330 lies centrally between the two outer interconnects 328 and 332 in said metalization level M3b. The interconnect 330 extends, like the entire coaxial line 321, in the x direction, e.g. by more than 50 micrometers or by more than 100 micrometers.

Using the modular construction once again, a metalization level M4b is produced by means of the same process steps likewise in SD architecture. The position, length and width of interconnects 324 and 332 match the values chosen in the metalization level M2b for the interconnects 324 and 326, respectively. The interconnects 324, 328 and 334 form one sidewall of the coaxial line 321. By contrast, the interconnects 326, 332 and 336 form the other sidewall of the coaxial line 321.

Likewise using the modular construction, a metalization level M5b is produced by means of the same process steps once again in SD architecture. The position, length and width of an interconnect 338 forming the top plate of the coaxial line 321 match the values chosen in the metalization level M1b for the interconnect 322. A shielding sheathing completely closed in the circumferential direction has thus been produced around the central coaxial interconnect 330 arranged in the metalization level M3b.

In the process steps described, dimensions have been stated only for the component currently of interest. It goes without saying that, in the context of the design rules, elsewhere on the wafer structures having other lateral dimensions may be fabricated which belong to other circuit parts, in particular to the circuit arrangements explained with reference to FIGS. 1 to 6.

The further processing and completion of the circuit are effected by means of the customary methods and processes. In other exemplary embodiments, more than five metalization levels are used for the production of the coaxial line. By way of example, the shielded central line is then formed by interconnects in two metalization levels. A coaxial line having a plurality of internal conductors insulated from one another is also produced in accordance with another exemplary embodiment, the internal conductors lying in one metalization level or in a plurality of metalization levels and the sheathing circumscribing e.g. a square or a rectangle in a cross section perpendicular to the longitudinal axis of the coaxial line. In other exemplary embodiments, the course of the coaxial line changes e.g. both in the x direction and in the y direction. The dimensions of the conductive structures in the individual metalization levels M1b to M5b can also be selected, e.g. minimum lateral widths of the interconnects for the sidewalls or for the internal conductors within the range of 0.1 micrometer to 2 micrometers.

Figure 5:
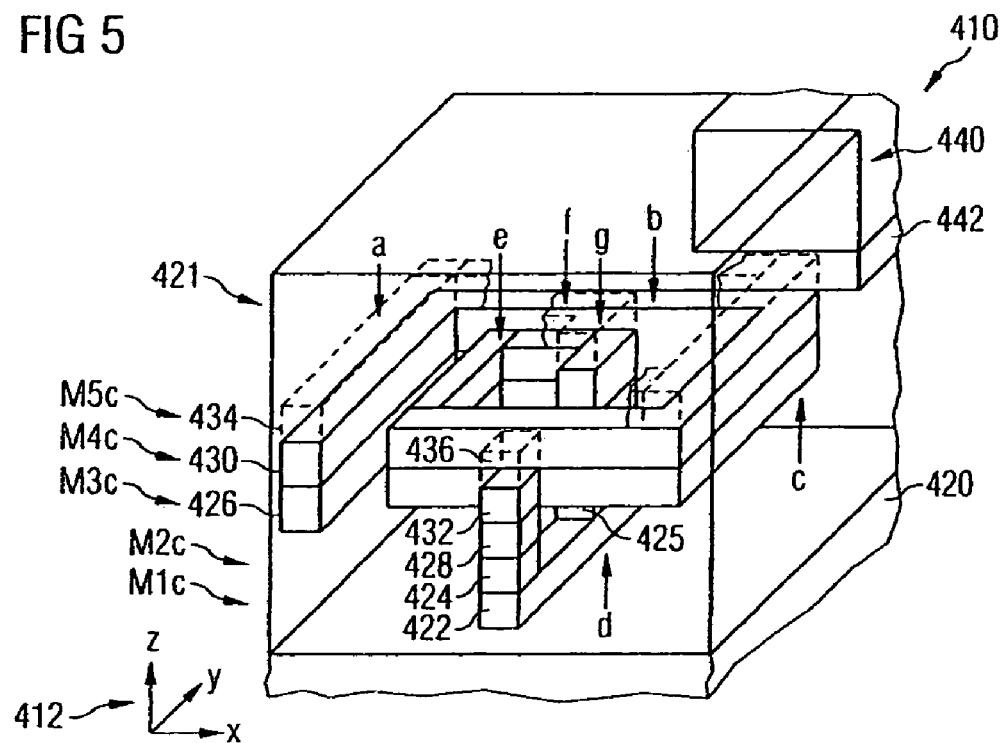
FIG. 5 shows a coil arranged in a metalization.

FIG. 5 shows a coil 421 arranged in a metalization of an integrated circuit arrangement 410. Firstly, process steps for the production of microelectronic devices on a substrate 420, such as e.g. on a silicon wafer, are carried out. This is then followed by the production of contacts of a contact level (not illustrated) and of conductive structures of a metalization level M1c and a metalization level M2c by means of the techniques explained with reference to FIG. 3. This gives rise to an interconnect 422 in the metalization level M1c, said interconnect corresponding to the interconnect 222 in terms of its dimensions, in terms of its position and in terms of its material. A via 424 corresponding to the via 224 arises, inter alia, in the metalization level M2c. An interconnect 425 corresponds to the interconnect of the metalization level M2a explained with reference to FIG. 2.

The metalization level M3c is produced in the way that the metalization level M3a is produced, an interconnect 426 of the coil 421 that corresponds to the interconnect 226 and also a via 428 corresponding to the via 228 being produced, inter alia. Appropriate interconnect materials for the interconnects 426 are W or Cu, but also Al, Au, Ag or others. The metalization level M3c replaces a plane with discrete vias at this location.

A metalization level M4c is then produced by means of RIE or some other subtractive patterning technique, an interconnect 430 corresponding to the interconnect 230 and a via 432 corresponding to the via 232 being produced, inter alia. Directly after the CMP process carried out beforehand, there is deposited a barrier layer or a barrier layer stack such as TaN/Ti/TiN having a thickness of e.g. 15 nm/10 nm/20 nm thickness, followed by e.g. 2.8 µm AlCu and an optional TiN layer having a thickness of e.g. approximately 40 nm. The depositions are effected sequentially in a PVD tool (physical vapor deposition) without vacuum interruption. The lateral dimensions of the fourth metalization level M4c are adapted to those of the metalization level M3c at the location of the coil 421 to be produced, or are slightly larger than those dimensions, and they can be chosen arbitrarily (in the context of the design rules) at other locations. The metal layer stack is then patterned e.g. in a chlorine-containing plasma RIE process ($Cl_2/BCl_3$ chemistry) with e.g. end point detection.

The following may then alternatively be effected:

a) the deposition and patterning of known passivation protective layers such as $SiO_2/Si_3N_4$, or b) the deposition of a leveling intermetal dielectric made e.g. of PECVD-$SiO_2$ (plasma enhanced chemical vapor deposition) and HDP-$SiO_2$ (high density plasma) having a sufficient total thickness (here: at least 2.8 µm), the planarization thereof by means of CMP and also the further deposition of a single PECVD-$SiO_2$ IMD on the plane support produced. The thickness thereof is chosen in accordance with the desired thickness of the subsequent metal plane, which is in turn produced in single damascene architecture. The sequence of the production steps for an optional metalization level M5c in SD architecture essentially corresponds to the description for the metalization level M3c, an interconnect 434 corresponding to the interconnect 234 and a via 436 corresponding to the via 236 being produced.

If the processing is ended with the production of passivation in accordance with option a) stated, then an integrated coil 421 has been produced with a total winding height of e.g. 4.0 µm such as can be realized only with difficulty and with high cost expenditure in traditional dual damascene architecture. Aluminum pads 442 can simultaneously be uncovered through corresponding openings 410 in the passivation layer of e.g. 60×80 µm², said pads being used for known bonding or contact-making purposes. The aluminum pads are likewise arranged in the metalization level M4c. This combination of damascene and RIE architecture is thus particularly appropriate for the cost-effective production of coils having a high quality factor.

With regard to the arrangement of sections a to g of the interconnects 426, 430 and 434, reference is made to sections A to G of the interconnects 226, 230 and 234, respectively, that have been explained above with reference to FIG. 3. The further processing and completion of the circuit are effected by means of the customary methods and processes.

Figure 6:
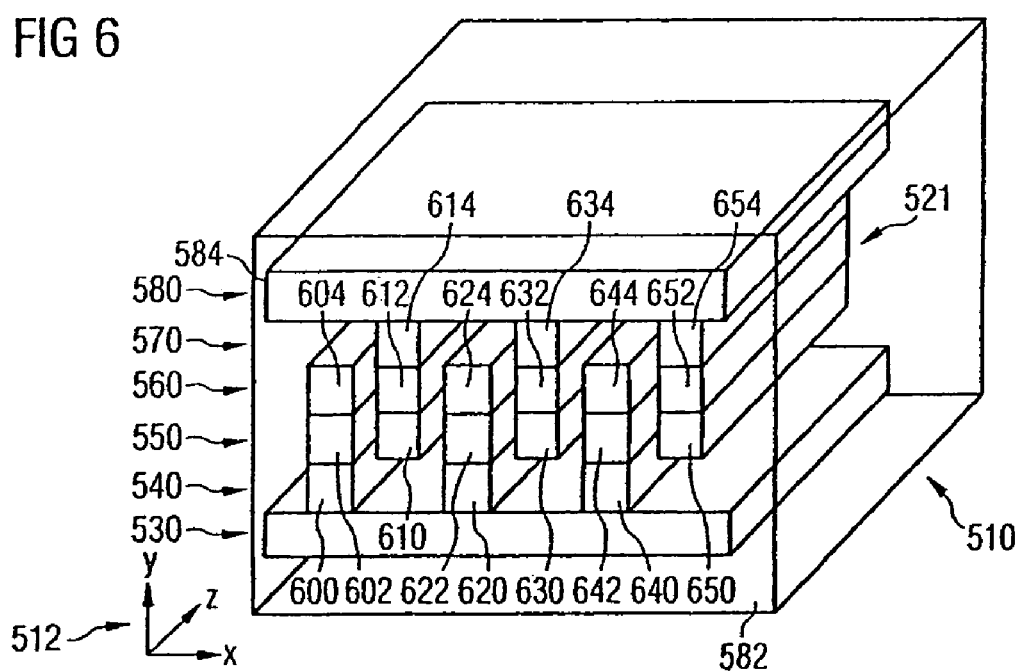
FIG. 6 shows a cross section through a metalization with an integrated capacitor.

FIG. 6 shows a cross section through a metalization of an integrated circuit arrangement 510 containing a capacitor 521. The capacitor arrangement 521 extends e.g. over six metalization levels 530 to 580 which directly adjoin one another in this order. The capacitor arrangement contains:

a conductive structure 582 having a large area in comparison with the middle conductive structures of the capacitor arrangement 521 in the metalization level 530, the conductive structure 582 simultaneously forming a baseplate and a connection plate for vertical electrodes of the capacitor arrangement 521, a conductive structure 584 having a large area in comparison with the middle conductive structures of the capacitor arrangement 521 in the metalization level 580, which has e.g.

the same area as the conductive structure 582 and which forms the top plate of the capacitor arrangement or the connection plate for vertical electrodes of the capacitor arrangement 521, a first vertical partial electrode comprising three conductive structures 600, 602 and 604 extending in the z direction, said conductive structures 600, 602 and 604 lying in the stated order in the metalization level 540, 550 and 560, respectively, and having identical x positions. The conductive structure 600 adjoins the conductive structure 582. All three conductive structures 600, 602 and 604 in each case have a length more than five times greater than their width.

A second vertical partial electrode comprising three conductive structures 610, 612 and 614 extending in the z direction, said conductive structures 610, 612 and 614 lying in the stated order in the metalization level 550, 560 and 570, respectively, and having identical x positions. The conductive structure 614 adjoins the conductive structure 584. All three conductive structures 610, 612 and 614 in each case have a length more than five times grater than their width.

A third vertical partial electrode comprising three conductive structures 620, 622 and 624 extending in the Z direction, said conductive structures 620, 622 and 624 lying in the stated order in the metalization level 540, 550 and 560 and having identical x positions. The conductive structure 620 adjoins the conductive structure 582. All three conductive structures 620, 622 and 624 in each case have a length more than five times greater than their width.

A fourth vertical partial electrode comprising three conductive structures 630, 632 and 634 extending in the z direction, said conductive structures 630, 632 and 634 lying in the stated order in the metalization level 550, 560 and 570, respectively, and having identical x positions. The conductive structure 634 adjoins the conductive structure 584. All three conductive structures 630, 632 and 634 in each case have a length more than five times greater than their width.

A fifth vertical partial electrode comprising three conductive structures 640, 642 and 644 extending in the z direction, said conductive structures 640, 642 and 644 lying in the stated order in the metalization level 540, 550 and 560 and having identical x positions. The conductive structure 640 adjoins the conductive structure 582. All three conductive structures 640, 642 and 644 in each case have a length more than five times greater than their width.

A sixth vertical partial electrode comprising three conductive structures 650, 652 and 654 extending in the z direction, said conductive structures 650, 652 and 654 lying in the stated order in the metalization level 550, 560 and 570, respectively, and having identical x positions. The conductive structure 654 adjoins the conductive structure 584. All three conductive structures 650, 652 and 654 in each case have a length more than five times greater than their width.

The first vertical electrode, the third vertical electrode and the fifth vertical electrode, which form parts of a first main electrode of the capacitor, are accordingly interlinked with the second vertical electrode, with the fourth vertical electrode and with the sixth vertical electrode, which form parts of a second main electrode of the capacitor 521. Situated between the vertical electrodes is an insulating material (not illustrated), e.g. silicon dioxide or a high k material having a relative permittivity of greater than 4.

In other exemplary embodiments, the middle conductive structures extend in the x direction. More or else fewer than six metalization levels are used for the capacitor arrangement. The number of vertical electrodes is also altered and lies e.g. between two and 100.

In the exemplary embodiment, the conductive structures illustrated in FIG. 6 are produced from copper or a copper alloy by means of a single damascene technique. In other exemplary embodiments, however, a different metal and a different production technique are used, e.g. an aluminum alloy that is patterned with the aid of RIE methods.

The passive components explained with reference to FIGS. 3 to 6 can be integrated both into conventional metalizations with alternate interconnect levels and via levels and into novel metalizations with a plurality of successive interconnect levels.

It is therefore intended that the foregoing detailed description be regarded as illustrative rather than limiting, and that it be understood that it is the following claims, including all equivalents, that are intended to define the spirit and scope of this invention.

The invention claimed is:

1. An integrated circuit arrangement, comprising:
    an integrated component, comprising:
        a first component interconnect near a substrate of the integrated component;
        a middle component interconnect remote from the substrate;
        a second component interconnect remote from the substrate;
        wherein the first component interconnect, middle component interconnect, and second component interconnect are arranged in an order from the first component interconnect, middle component interconnect, and second component interconnect at an increasing distance from the substrate;
        wherein each of the first, middle, and second component interconnects comprise a planar bottom area and a planar top area in a component section, the planar bottom area and planar top area of the first, middle, and second component interconnects lie in different planes that are parallel to one another;
        wherein in the component section, the each of the first, middle, and second component interconnects has a length at least five times greater than a width of the respective component interconnect; and
        wherein in the component section, the planar top area of the middle component interconnect is in direct contact with the planar bottom area of the second component interconnect and the planar bottom area of the middle component interconnect is in direct contact with the planar top area of the first component interconnect.

2. The integrated circuit arrangement of claim 1, wherein the component section forms at least one turn of a coil.

3. The integrated circuit arrangement of claim 2, wherein the top area of the middle component interconnect adjoins the bottom area of the second component interconnect along at least 50 micrometers, and wherein the bottom area of the middle component interconnect adjoins the top area of the first component interconnect along at least 50 micrometers.

4. The integrated circuit arrangement of claim 1, wherein the first, middle, and second component interconnects lie in one of a plurality of conductive structure levels.

5. The integrated circuit arrangement of claim 4, wherein at least one of the plurality of conductive structure levels is an interconnect level comprising wiring interconnects and wherein a conductive structure level of the plurality of conductive structure level adjoining the interconnect level is a via level.

6. The integrated circuit arrangement of claim 4, wherein two adjoining conductive structure levels of the plurality of conductive structure levels are interconnect levels comprising wiring interconnects.

7. The integrated circuit arrangement of claim 6, wherein the wiring interconnects each comprise a middle section that is not adjoined by a conductive structure of another conductive structure level.

8. The integrated circuit arrangement of claim 4, wherein the first, middle, and second component interconnects are each positioned in a different conductive structure level of the plurality of conductive structure levels.

9. The integrated circuit arrangement of claim 1, wherein a different electrically conductive material than in an interior of the component interconnects is arranged on the bottom areas of the component interconnects.

10. An integrated circuit arrangement, comprising:
an integrated component, comprising:
a first component interconnect near a substrate of the integrated component;
a second component interconnect remote from the substrate;
wherein the first and second component interconnect are arranged in an order of the first component interconnect and a second component interconnect at increasing distance from the substrate;
wherein the first and second component interconnects comprise an identical course in a component section of the integrated component;
wherein in the component section, the first and second component interconnects each comprise a planar bottom area and a planar top area in the component section, the planar bottom area and planar top of the first and second component interconnects lie in different planes that are parallel to one another;
wherein in the component section, the first and second component interconnects each having a length at least five times greater than a width of the respective component interconnect; and
wherein in the component section, the planar top area of the first component interconnect is in direct contact with the planar bottom area of the second component interconnect.

11. The integrated circuit arrangement of claim 10, wherein the component section forms at least one turn of a coil.

12. The integrated circuit arrangement of claim 11, wherein the top area of the first component interconnect adjoins the bottom area of the second component interconnect along at least 50 micrometers.

13. The integrated circuit arrangement of claim 10, wherein the first and second component interconnects lie in one of a plurality of conductive structure levels.

14. The integrated circuit arrangement of claim 13, wherein at least one of the plurality of conductive structure levels is an interconnect level comprising wiring interconnects and wherein a conductive structure level of the plurality of conductive structure level adjoining the interconnect level is a via level.

15. The integrated circuit arrangement of claim 13, wherein two adjoining conductive structure levels of the plurality of conductive structure levels are interconnect levels comprising wiring interconnects.

16. The integrated circuit arrangement of claim 15, wherein the wiring interconnects each comprise a middle section that is not adjoined by a conductive structure of another conductive structure level.

17. The integrated circuit arrangement of claim 13, wherein the first, middle, and second component interconnects are each positioned in a different conductive structure level of the plurality of conductive structure levels.

18. The integrated circuit arrangement of claim 10, wherein a different electrically conductive material than in an interior of the component interconnects are arranged on the bottom areas of the component interconnects.

19. The integrated circuit arrangement of claim 18, wherein the bottom areas of the component interconnects comprises at least one of tantalum, tantalum nitride, titanium, titanium nitride, tungsten, tungsten nitride, and ruthenium.

* * * * *

UNITED STATES PATENT AND TRADEMARK OFFICE
CERTIFICATE OF CORRECTION

| | |
|---|---|
| PATENT NO. | : 7,656,037 B2 |
| APPLICATION NO. | : 11/525113 |
| DATED | : February 2, 2010 |
| INVENTOR(S) | : Hommel et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 402 days.

Signed and Sealed this

Twenty-eighth Day of December, 2010

David J. Kappos
*Director of the United States Patent and Trademark Office*